(12) United States Patent
Grudowski et al.

(10) Patent No.: US 7,528,029 B2
(45) Date of Patent: May 5, 2009

(54) STRESSOR INTEGRATION AND METHOD THEREOF

(75) Inventors: Paul A. Grudowski, Austin, TX (US); Darren V. Goedeke, Pflugerville, TX (US); John J. Hackenberg, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 366 days.

(21) Appl. No.: 11/408,347

(22) Filed: Apr. 21, 2006

(65) Prior Publication Data

US 2007/0249113 A1    Oct. 25, 2007

(51) Int. Cl.
*H01L 21/8238*    (2006.01)

(52) U.S. Cl. ............... 438/199; 438/229; 438/230; 438/592

(58) Field of Classification Search ........... 438/199, 438/229, 230, 232, 233, 592
See application file for complete search history.

(56) References Cited

U.S. PATENT DOCUMENTS

| | | | |
|---|---|---|---|
| 6,410,938 B1 | 6/2002 | Xiang | |
| 6,696,334 B1 * | 2/2004 | Hellig et al. | 438/230 |
| 7,015,089 B2 * | 3/2006 | Hsu et al. | 438/241 |
| 7,244,644 B2 * | 7/2007 | Zhu et al. | 438/199 |
| 2003/0181005 A1 * | 9/2003 | Hachimine et al. | 438/231 |
| 2004/0075148 A1 | 4/2004 | Kumagai et al. | |
| 2005/0098829 A1 | 5/2005 | Doris et al. | |

OTHER PUBLICATIONS

PCT Search report and Written Opinion for corresponding PCT Application No. PCT/US07/63439 mailed Jun. 24, 2008.

* cited by examiner

*Primary Examiner*—Michael Trinh
(74) *Attorney, Agent, or Firm*—Fortkort & Houston, P.C.; John A. Fortkort

(57) ABSTRACT

A method is provided for making a semiconductor device. In accordance with the method, a substrate (203) is provided which has first (205) and second (207) gate structures thereon. A first stressor layer (215) is formed over the substrate, and a sacrificial layer (216) is formed over the first stressor layer. A second stressor layer (219) is formed over the sacrificial layer.

20 Claims, 6 Drawing Sheets

US 7,528,029 B2

STRESSOR INTEGRATION AND METHOD THEREOF

FIELD OF THE DISCLOSURE

The present disclosure relates generally to semiconductor devices, and more particularly to methods for making semiconductor devices having dual etch stop layer (ESL) stressor structures.

BACKGROUND OF THE DISCLOSURE

The use of a thin layer of strained silicon in the channel layer of CMOS devices has been found to improve the performance characteristics of these devices. The presence of strain in the channel layer causes the individual silicon atoms within that layer to be forced farther apart or closer together in their lattice structure than would be the case in the unstrained material. The larger or smaller lattice spacing results in a change in the electronic band structure of the device such that current carriers (i.e., electrons and holes) have higher mobilities within the channel layer, thereby resulting in higher currents in the transistor and faster circuit speeds.

In CMOS devices, strained channel layers may be achieved by imparting local mechanical stresses to the device. Electron mobility, and therefore NMOS performance, may be improved by imparting tensile stress along (i.e., parallel to) the direction of current flow or orthogonal to the direction of current flow. Hole mobility, and therefore PMOS performance, may be enhanced by imparting compressive stress parallel to the direction of current flow, and by imparting tensile stress perpendicular to the direction of current flow.

Contact etch stop layer (ESL) films may be utilized to impart local mechanical stresses, and in particular tensile or compressive stresses, to the channel layer of an NMOS or PMOS device. Thus, tensile stress may be imparted to an NMOS channel by applying a tensile etch stop film, and compressive stress may be imparted to a PMOS channel by applying a compressive etch stop film. However, in order to maximize CMOS performance, it is desirable to avoid applying either a compressive film or a tensile film to both regions of a CMOS transistor, since compressive films can degrade NMOS performance, while tensile films can degrade PMOS performance. Consequently, methods have been developed in the art to separately apply tensile films and compressive films, respectively, to only the NMOS and PMOS regions of a CMOS transistor.

Despite the performance enhancements that such methods potentially offer for CMOS transistors, in practice, the properties of the resulting transistor often vary considerably. Moreover, the methods commonly used to make these transistors often generate an unacceptably large number of defects. There is thus a need in the art for a method for making CMOS transistors such that the properties in the resulting transistors are more consistent, and such that the incidence of defects is reduced. These and other needs may be met by the methodologies and devices described herein.

DETAILED DESCRIPTION

Figure 1:
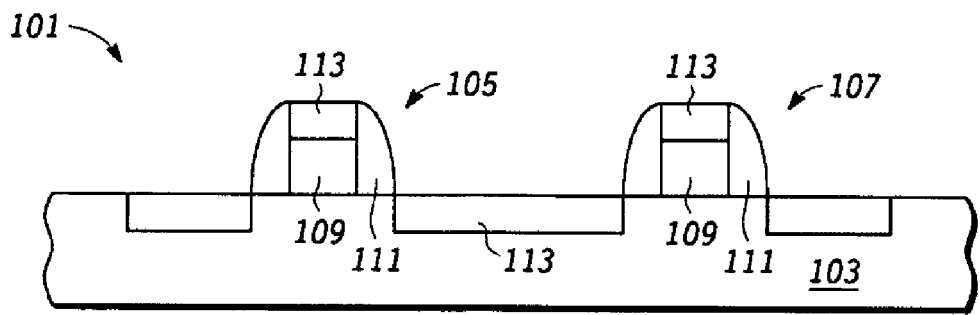
FIG. 1 illustrates a step in a prior art process for making a dual stressor structure.

In one aspect, a method is provided for making a semiconductor device. In accordance with the method, a substrate is provided which has first and second gate structures thereon. A first stressor layer is formed over the substrate, and a sacrificial layer is formed over the first stressor layer. A second stressor layer is formed over the sacrificial layer.

In another aspect, a method for making a semiconductor device is provided. In accordance with the method, a substrate is provided having first and second gate structures thereon, wherein the first gate structure is disposed in an NMOS region of the device, and wherein the second gate structure is disposed in a PMOS region of the device. A first stress inducing layer is formed over the substrate. The device is then masked such that the first gate structure is exposed and the second gate structure is covered, and the first stress inducing layer is partially etched with a first etch such that a portion of the first stress inducing layer covers the first gate structure.

These and other aspects of the present disclosure are described in greater detail below.

Without wishing to be bound by theory, it is believed that the incidence of defects and variations in device performance observed in CMOS devices arises, in part, because the etch processes used to define the tensile stressor and compressive stressor films also partially etch the metal silicide regions on the substrate (including those which extend over the source and drain regions, as well as those which extend over the gate electrodes), thereby gouging these regions. Similarly, it is also believed that these etch processes can result in thinning of one or both stressor films, which in turn modifies the amount of compressive or tensile stress that they apply to the channel regions of the device.

It has now been found that the aforementioned problems can be overcome through the provision of a process for making CMOS transistors that protects the substrate and the tensile stressor and compressive stressor films during the etch processes used to define these films. In particular, it has been found that the substrate (and in particular, the metal silicide regions defined thereon) may be protected from gouging by substituting a multi-step etch for the single dry etch commonly used to remove these films from the portions of the substrate where their presence is not desired. In such a multi-step etch process, a first etch may be utilized to remove the bulk of the film, while a second etch (or plurality of etches) may be used to remove the remaining portion of the film. The first etch may be, for example, a timed etch with a high etch rate, while the second etch may be an etch which has higher selectivity to the substrate (and to the metal silicide regions defined thereon) than the first etch.

It has also been found that the tensile stressor and/or compressive stressor films may be protected from thinning though the provision of a sacrificial layer (preferably an oxide layer) disposed between them. An etch having suitable selectivity to the sacrificial layer may then be used to remove one of the stressor films without etching or thinning the remaining film. The sacrificial layer may later be removed with a suitable etch that is selective to the remaining stressor film. This approach permits selective etching of tensile and compressive stressor films within the same CMOS structure which are chemically similar or identical, without the incidence of thinning or etching.

The methodologies disclosed herein may be appreciated in the context of the prior art process depicted in FIGS. 1-9, which show a process for making a MOSFET device with a dual etch stop layer (ESL) stressor integration. These figures have been simplified in certain aspects for simplicity and clarity of illustration. Thus, for example, although not shown in the figures, it will be appreciated that the NMOS and PMOS regions in a semiconductor device will typically be isolated from each other by way of one or more trench isolation structures.

As shown in FIG. 1, a structure 101 is provided which comprises a substrate 103 upon which are defined first 105 and second 107 gate structures corresponding, respectively, to the PMOS and NMOS regions of a CMOS device. Each of the gate structures 105, 107 comprises a gate electrode 109 and adjacent spacer structures 111. A layer of silicide 113 is present on the gate electrodes 109 and the portions of the substrate 103 adjacent thereto.

Figure 2:
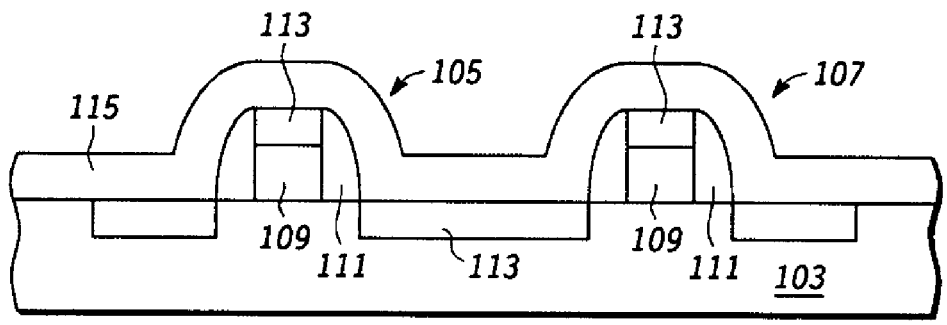
FIG. 2 illustrates a step in a prior art process for making a dual stressor structure.

Referring now to FIG. 2, a tensile stressor layer 115 is deposited over the structure. The tensile stressor layer 115 is preferably deposited as a conformal layer.

Figure 3:
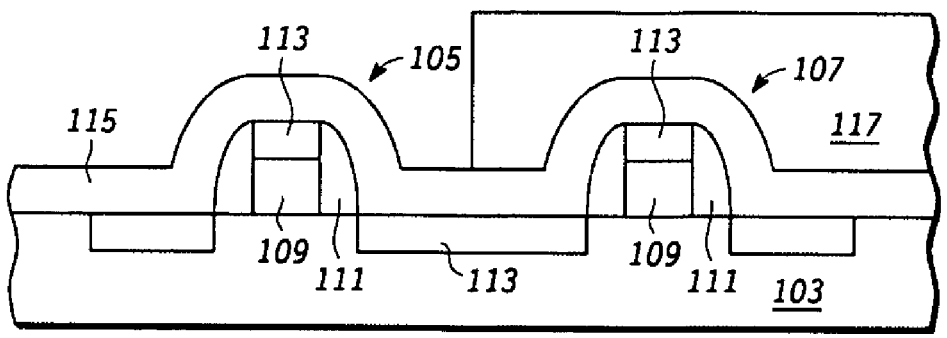
FIG. 3 illustrates a step in a prior art process for making a dual stressor structure.
Figure 4:
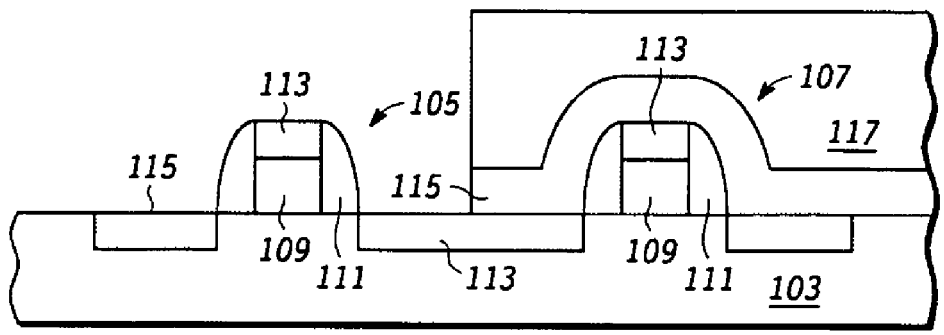
FIG. 4 illustrates a step in a prior art process for making a dual stressor structure.
Figure 5:
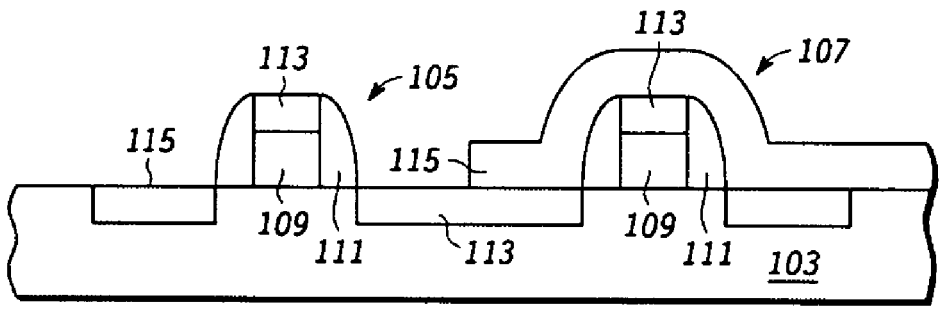
FIG. 5 illustrates a step in a prior art process for making a dual stressor structure.
Figure 6:
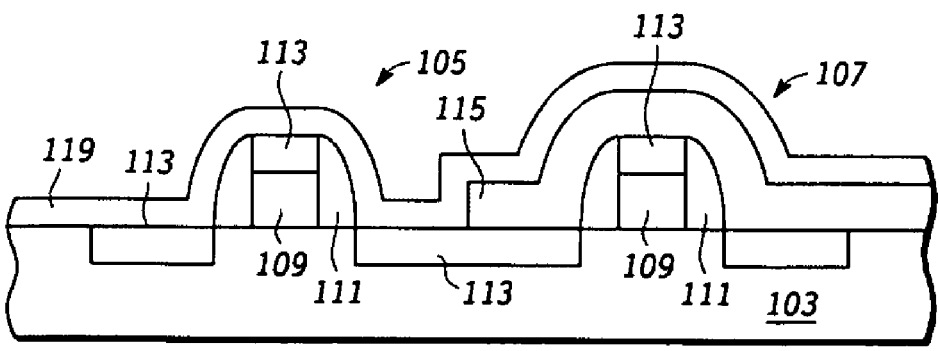
FIG. 6 illustrates a step in a prior art process for making a dual stressor structure.

As shown in FIG. 3, a first layer of photoresist 117 is then deposited over the structure and is patterned such that the region of the structure containing the first gate structure 105 is exposed, and the region of the structure containing the second gate structure 107 is masked. The exposed portion of the tensile stressor layer 115 is then removed from the device with a dry etch, as shown in FIG. 4. The first layer of photoresist 117 is then stripped as shown in FIG. 5, after which a conformal compressive stressor layer 119 is deposited over the structure, as shown in FIG. 6.

Figure 7:
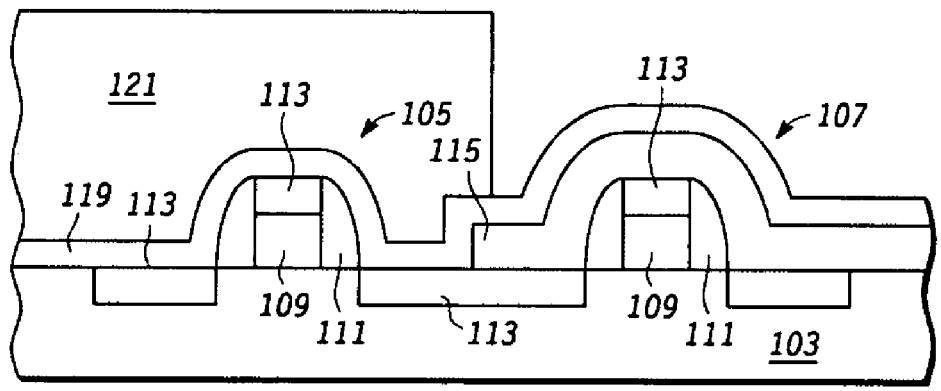
FIG. 7 illustrates a step in a prior art process for making a dual stressor structure.
Figure 8:
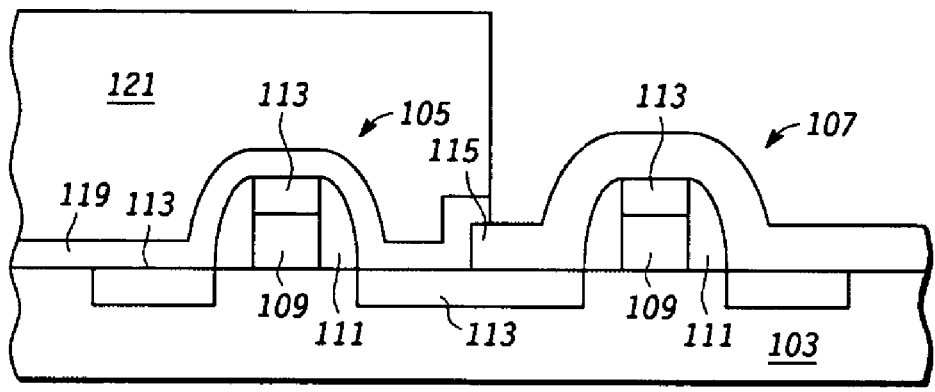
FIG. 8 illustrates a step in a prior art process for making a dual stressor structure.
Figure 9:
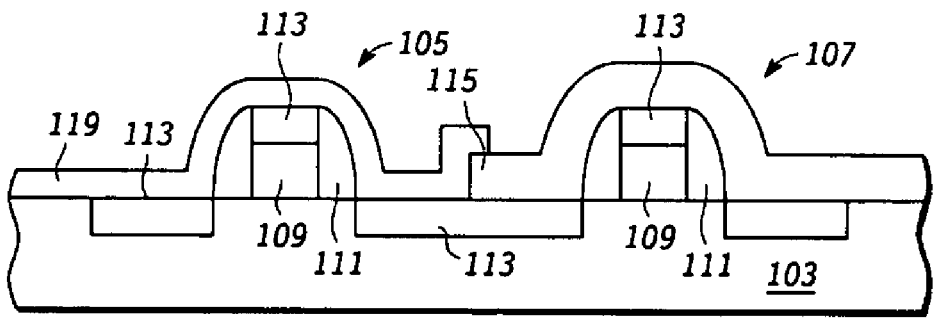
FIG. 9 illustrates a step in a prior art process for making a dual stressor structure.

Referring now to FIG. 7, a second layer of photoresist 121 is deposited and patterned such that the region of the structure containing the second gate structure 107 is exposed, and the region of the structure containing the first gate structure 105 is masked. As shown in FIG. 8, the compressive stressor layer 119 is then removed from the exposed region with a suitable etchant. The second layer of photoresist 121 is then stripped to yield the structure shown in FIG. 9.

The foregoing process suffers from some notable infirmities. In particular, it relies on a dry etch to remove the portion of the tensile stressor layer 115 which extends over the first gate structure 105 (see FIG. 4) in the PMOS region of the device. This etch frequently results in gouging of the underlying metal silicide 113, and hence degradation of the electrical properties of the device.

Moreover, this process relies on etching to remove the portion of the compressive stressor layer 119 which extends over the second gate structure 107 in the NMOS region of the device (see FIGS. 7-8). In many cases, the compressive and tensile stressor layers may be chemically similar or identical (for example, both may comprise layers of SiN which has been processed differently to be intrinsically tensile or compressive). Hence, the dry etch selectivity between the two is frequently poor. Consequently, this etch process tends to cause thinning of the tensile stressor layer 115 in the NMOS region of the transistor. As an added complication, the extent of this thinning may be somewhat unpredictable and difficult to control. Consequently, this process results in variable tensile stress in the NMOS channel region of the resulting transistors, and hence undesirable variation in the electrical properties of these devices. Also, the variation in the thickness of this contact etch stop layer can give rise to defects and, therefore, circuit yield issues.

Figure 10:
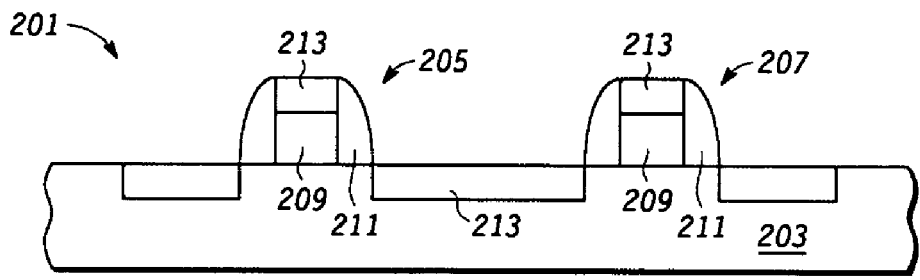
FIG. 10 illustrates a step in one embodiment of a process for making a dual stressor structure in accordance with the teachings herein.

The aforementioned infirmities may be overcome by the process depicted in FIGS. 10-18. With reference to FIG. 10, the process begins with a structure 201 which is similar to the structure depicted in FIG. 1. This structure comprises a semiconductor substrate 203 upon which are defined first 205 and second 207 gate structures corresponding, respectively, to the PMOS and NMOS regions of a CMOS transistor. Each of the gate structures 205, 207 comprises a gate electrode 209 and adjacent spacer structures 211. A layer of metal silicide 213 is present on the gate electrodes 209 and on the portions of the substrate 203 adjacent thereto.

Figure 11:
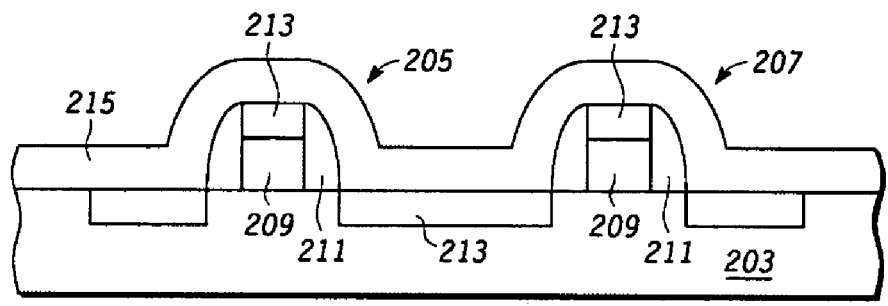
FIG. 11 illustrates a step in one embodiment of a process for making a dual stressor structure in accordance with the teachings herein.
Figure 12:
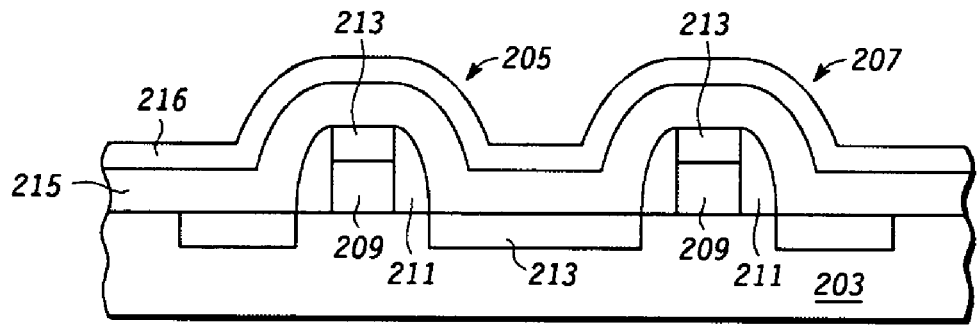
FIG. 12 illustrates a step in one embodiment of a process for making a dual stressor structure in accordance with the teachings herein.

Referring now to FIG. 11, a tensile stressor layer 215 is deposited over the structure. The tensile stressor layer 215 is preferably deposited as a conformal layer. An oxide layer 216 is then deposited over the tensile stressor layer 215 as shown in FIG. 12.

Figure 13:
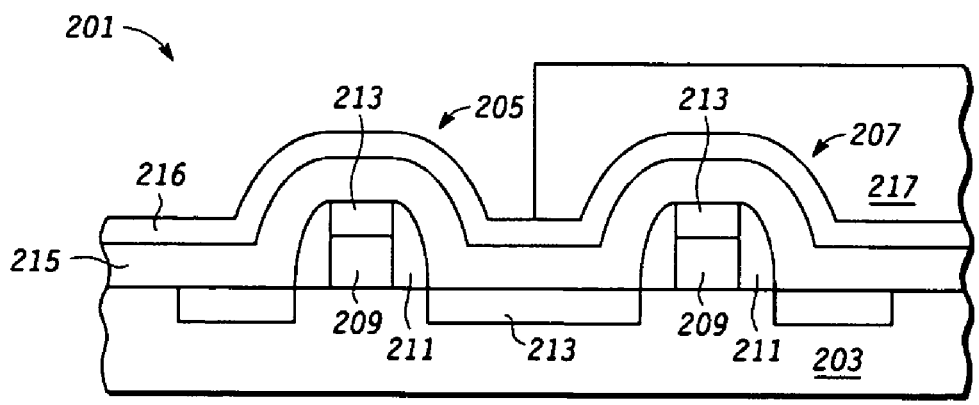
FIG. 13 illustrates a step in one embodiment of a process for making a dual stressor structure in accordance with the teachings herein.
Figure 14:
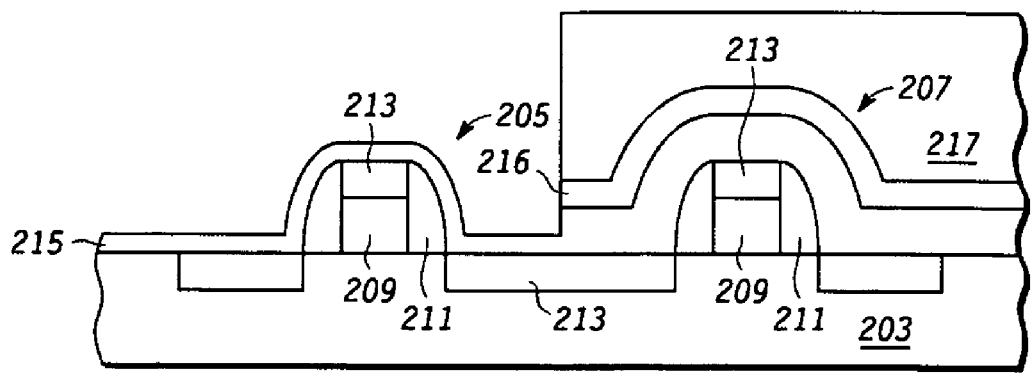
FIG. 14 illustrates a step in one embodiment of a process for making a dual stressor structure in accordance with the teachings herein.

Referring now to FIG. 13, a first layer of photoresist 217 is then deposited over the structure and is patterned such that the region of the structure containing the first gate structure 205 is exposed, and the region of the structure containing the second gate structure 207 is masked. The oxide layer 216 and a portion of the tensile stressor layer 215 are then etched in the exposed portion of the device as shown in FIG. 14. Preferably, a plasma etch is used to remove both the oxide layer 216 and the bulk of the tensile stressor layer 215. This can be done with a timed etch or an endpoint detection etch.

Figure 15:
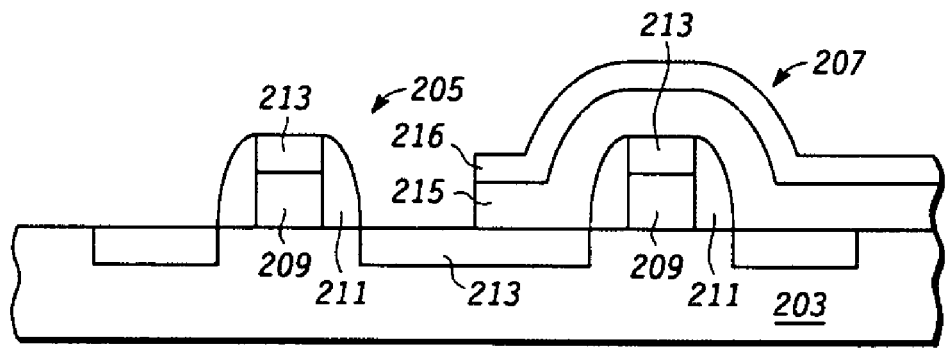
FIG. 15 illustrates a step in one embodiment of a process for making a dual stressor structure in accordance with the teachings herein.

Next, as shown in FIG. 15, the first layer of photoresist 217 is stripped, and an additional (dry or wet) etch is utilized to remove the remaining portion of the tensile stressor layer 215, using the oxide layer 216 as a hard mask. In some variations of this process, the etch may be implemented before the first layer of photoresist 217 is stripped. Notably, an etch (dry or wet) may be used which has much higher selectivity to both the oxide hard mask layer 216 and the metal silicide 213 than the dry etch used to remove the bulk of the tensile stressor layer 215. In another embodiment, a multiple-step etch is used, rather than just two steps, to better control the removal of all material.

Figure 16:
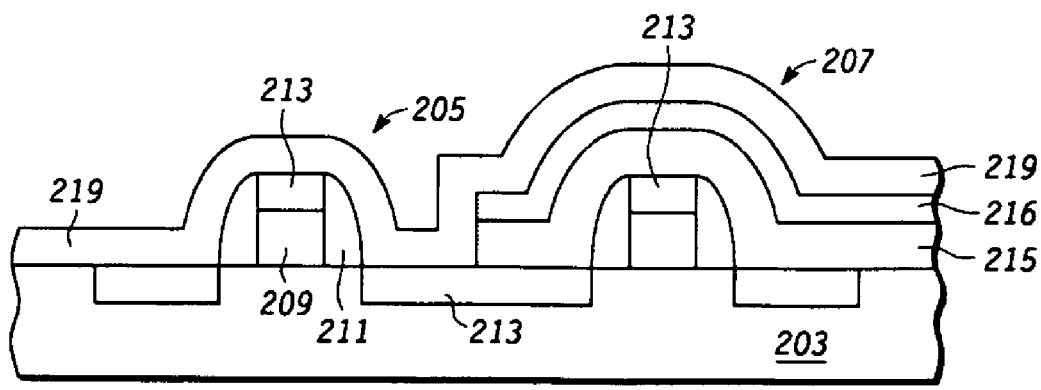
FIG. 16 illustrates a step in one embodiment of a process for making a dual stressor structure in accordance with the teachings herein.
Figure 17:
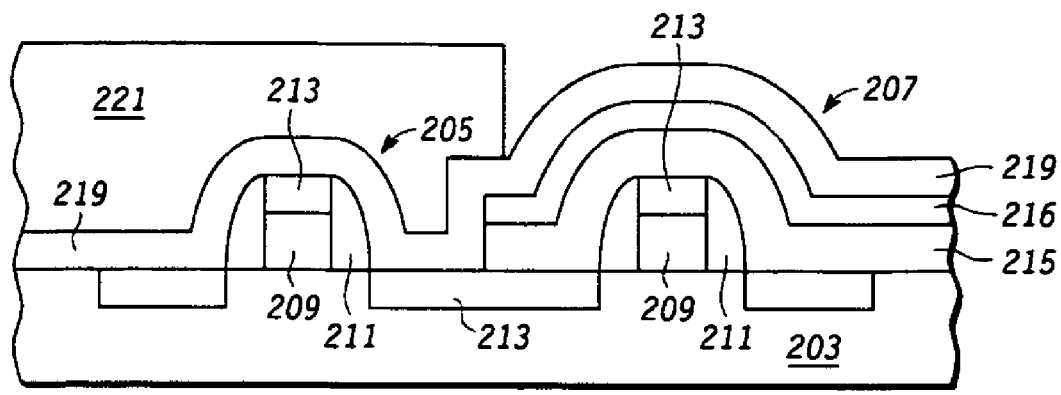
FIG. 17 illustrates a step in one embodiment of a process for making a dual stressor structure in accordance with the teachings herein.
Figure 18:
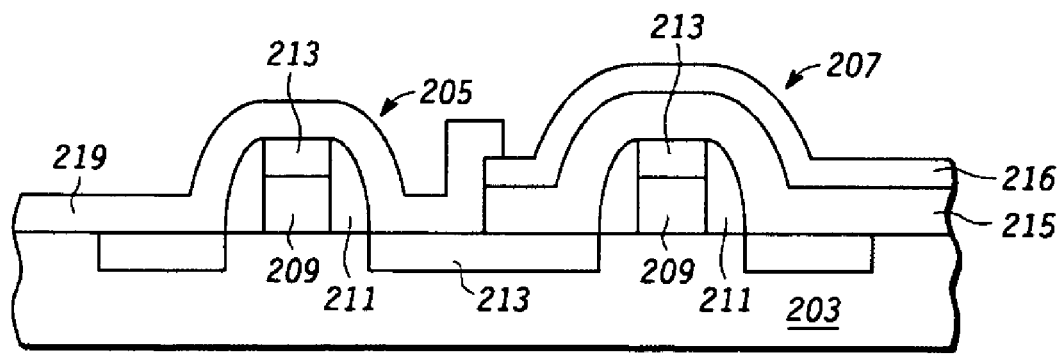
FIG. 18 illustrates a step in one embodiment of a process for making a dual stressor structure in accordance with the teachings herein.

Referring now to FIG. 16, a conformal compressive stressor layer 219 is deposited over the structure. A second layer of photoresist 221 is then deposited over the structure as shown in FIG. 17 and is patterned such that the region of the structure containing the second gate structure 207 is exposed, and the region of the structure containing the first gate structure 205 is masked. As shown in FIG. 18, the exposed portion of the compressive stressor layer 219 is then removed with a suitable etchant, using the oxide layer 216 as an etch stop, and the second layer of photoresist 221 is then stripped.

A number of variations and modifications are possible to the procedure depicted in FIGS. 10-18 beyond those already noted. For example, rather than depositing the tensile layer first, the compressive layer could be deposited first. This could be achieved, for example, by modifying the procedure depicted in FIGS. 10-18 such that layer 215 is the compressive stressor layer and layer 219 is the tensile stressor layer, and such that the first 205 and second 207 gate structures correspond, respectively, to the NMOS and PMOS regions of the CMOS transistor.

The process depicted in FIGS. 10-18 has a number of advantages over the prior art process depicted in FIGS. 1-9. These advantages may be appreciated with respect to FIG. 19 which, when compared to the structure of FIG. 18, reflects some of the defects that can arise from the prior art process depicted in FIGS. 1-9. In particular, as previously noted, the dry etch used in the prior art process of FIGS. 1-9 can result in gouging of the metal silicide layer 213 (this gouging is depicted as regions 231 in FIG. 19, and consequent degradation of the electrical properties of the device. By contrast, in the process depicted in FIGS. 10-18, the tensile stressor layer 215 is etched in two steps. In the first step, the bulk of the tensile stressor material 215 may be removed, preferably with a timed or end pointed dry etch. The remaining portion of the tensile stressor layer 215 is then removed with a suitable etch, dry etch or wet etch, which has a high selectivity to the metal silicide 213. Consequently, gouging of the metal silicide 213 is avoided.

Figure 19:
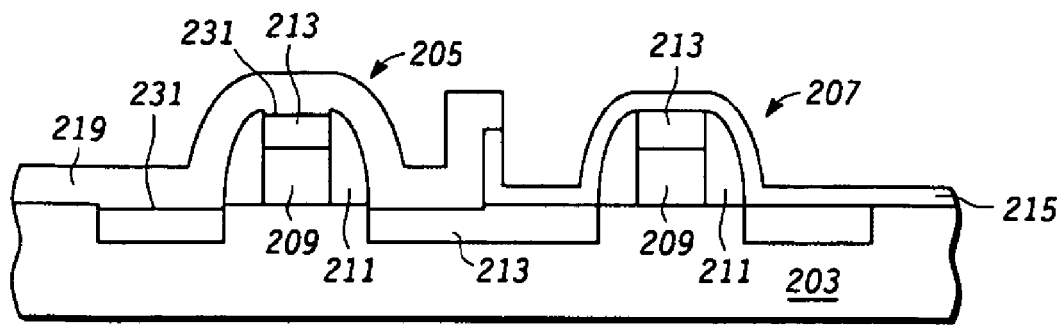
FIG. 19 illustrates some of the defects that can arise in a CMOS transistor made in accordance with the process depicted in FIGS. 1-9.

Moreover, the process of FIGS. 10-18 utilizes an oxide layer 216 which is disposed between the tensile stressor layer 215 and the compressive stressor layer 219. During subsequent removal of the compressive stressor layer 219 from the NMOS region of the device, this oxide layer 216 serves as a hard mask or etch stop layer which prevents thinning of the compressive stressor layer 219 during the etch as depicted in FIG. 19 (the effect of thinning has been exaggerated somewhat in FIG. 19 for purposes of illustration). Consequently, the process depicted in FIGS. 10-18 permits the use of chemically similar or identical materials to induce both tensile stress and compressive stress in the appropriate regions of the CMOS transistor, without thinning of the tensile stressor layer 215 during removal of the compressive stressor layer 219 from the PMOS region of the device.

The materials used in the stressor layers in the methods and devices described herein may comprise refractory insulating materials or materials with selective etch and physical properties. Such films may comprise, for example, silicon nitride (e.g., $Si_3N_4$ or $Si_xN_y$) and/or silicon oxynitride (e.g., $Si_xON_y$). These materials may be grown or blanket deposited in a conventional manner, such as by chemical vapor deposition (CVD), plasma enhanced chemical vapor deposition (PECVD) or physical vapor deposition (PVD). Such films can be made with a well controlled thickness.

The physical properties of the stressor films described herein, including the type and magnitude of the stress that these films apply, may be selected through appropriate manipulation of the process parameters used to form the film. Such parameters include, for example, deposition pressure, plasma power, process chemistry, and the spacing between the wafer and the electrode. By way of example, a tensile film exhibiting a tensile stress of approximately greater than 1000 MPa may be achieved using the following CVD parameters: a temperature of approximately 350-500° C., a pressure of approximately 1-10 Torr, a spacing between the wafer and the electrode of 1.0-1.3 cm, a combination of process gases such as silane and ammonia and inert gases such as nitrogen, helium, and argon, and a total RF power density in a range of approximately 0.05-0.32 watts per square centimeter ($W/cm^2$). Similarly, a compressive film exhibiting a compressive stress whose magnitude is approximately greater than −2000 MPa may be achieved with the following CVD parameters: a temperature of approximately 350-500° C., a pressure of approximately 1-10 Torr, a spacing between the wafer and the electrode of 0.05-1.1 cm, a combination of process gases such as silane and ammonia and inert gases such as nitrogen, helium, and argon, and a total RF power density in a range of approximately 0.05-0.8 $W/cm^2$.

Various wet and dry etches may be used in the processes described herein to remove the remaining portion of the tensile stressor from the NMOS region of the device. Dry etching of the ESL films can be accomplished by using standard etch techniques using halogen containing gases, either alone or combined with other gases, which could include carrier gases. The choice of gases is dependent on the type of selectivities required. For the initial, typically more aggressive etch (see, for example, the etch depicted in FIG. 14) of a multi-step etch process, typical etchant gases may include, but are not limited to, $CF_4$, $CHF_3$, $CH_3F$, $SF_6$ and $NF_3$. For the second, typically less aggressive etch or etches (see, for example, the etch depicted in FIG. 15) of such a multi-step etch process, gasses of choice may include, but are not limited to, $CH_2F_2$, $C_4F_8$, $C_4F_6$, CO, $N_2$, and Ar. Suitable wet etchants include, but are not limited to, dilute, aqueous solutions of HF, with $HF:H_2O$ concentrations of approximately 1:50 to 1:1000.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a semiconductor device, comprising:
   providing a substrate having first and second regions thereon, wherein said first region includes a first gate structure and a first suicide region, and wherein said second region includes a second gate structure and a second suicide region;
   forming a first stressor layer having a first segment which extends over the first region and a second segment which extends over the second region;
   forming a first mask over the first stressor layer such that the first segment is exposed and the second segment is covered;
   removing a first portion of the first segment with a first etch; and
   removing a second portion of the first segment with a second etch so as to expose the first suicide region;
   wherein the second etch has greater selectivity to the first suicide region than the first etch.

2. The method of claim 1, further comprising:
forming a sacrificial layer over the first stressor layer; and
forming a second stressor layer over the sacrificial layer;
wherein the second stressor layer is disposed over the first stressor layer.

3. The method of claim 2, wherein the semiconductor device is a CMOS transistor.

4. The method of claim 3, wherein the first gate structure is disposed in a PMOS region of the transistor, and wherein the second gate structure is disposed in an NMOS region of the transistor.

5. The method of claim 4, wherein the first stressor layer extends over the second gate structure, and wherein the second stressor layer extends over the first gate structure.

6. The method of claim 4, wherein the first stressor layer is selectively removed from the PMOS region, and wherein the second stressor layer is selectively removed from the NMOS region.

7. The method of claim 6, wherein the second stressor layer is selectively removed from the NMOS region by etching, and wherein the sacrificial layer is utilized as an etch stop layer during the etching.

8. The method of claim 4 wherein, when the first stressor layer is formed, it extends over the first and second gate structures.

9. The method of claim 8, wherein the second portion of the first stressor layer covers the entire first region.

10. The method of claim 1, wherein the first mask is removed before the second etch.

11. The method of claim 1, wherein the first mask is removed after the second etch.

12. The method of claim 1, wherein the second etch utilizes a gas selected from the group consisting of $CH_2F_2$, $C_4F_8$, $C_4F_6$, CO, $N_2$, and Ar.

13. The method of claim 1, wherein the second etch is an aqueous HF etch.

14. The method of claim 2, further comprising:
removing the first mask; and
forming the second stressor layer such that it extends over the first and second gate structures.

15. The method of claim 14, further comprising:
forming a second mask such that the portion of the second stressor layer which extends over the second gate structure is exposed, and the portion of the second stressor layer which extends over the first gate structure is covered; and
removing the exposed portion of the second stressor layer.

16. The method of claim 2, wherein the first stressor layer imparts tensile stress to the substrate, and wherein the second stressor layer imparts compressive stress to the substrate.

17. The method of claim 2, wherein the first and second stressor layers comprise silicon nitride.

18. The method of claim 2, wherein the second stressor layer imparts tensile stress to the substrate, and wherein the first stressor layer imparts compressive stress to the substrate.

19. A method for making a semiconductor device, comprising:
providing a substrate having first and second gate structures and first and second layers of silicide thereon, wherein the first gate structure is disposed in an NMOS region of the device, and wherein the second gate structure is disposed in a PMOS region of the device;
forming a first layer of a first stress inducing material over the substrate;
masking the device such that the first gate structure is exposed and the second gate structure is covered
partially etching the first layer of stress inducing material with a first etch such that a portion of the first layer completely covers the first gate structure: and
removing the portion of the first layer covering the first gate structure with a second etch selective to the first suicide layer.

20. The method of claim 19, further comprising:
forming a second layer of a second stress inducing material over the first layer of stress inducing material, wherein the first and second stress inducing materials are chemically distinct.

* * * * *

UNITED STATES PATENT AND TRADEMARK OFFICE
CERTIFICATE OF CORRECTION

PATENT NO. : 7,528,029 B2
APPLICATION NO. : 11/408347
DATED : May 5, 2009
INVENTOR(S) : Paul A. Grudokski et al.

It is certified that error appears in the above-identified patent and that said Letters Patent is hereby corrected as shown below:

On the Title page, Item (75) Inventors, please correct the second inventor's surname to --Goedeke--.

Column 6, line 53, please delete "suicide" and insert therefore -- silicide --.

Column 6, line 55, please delete "suicide" and insert therefore -- silicide --.

Column 6, line 65, please delete "suicide" and insert therefore -- silicide --.

Column 6, line 67, claim 1 please delete "suicide" and insert therefore -- silicide --.

Column 8, line 32, claim 19 please delete "suicide" and insert therefore -- silicide --.

Signed and Sealed this

Eighteenth Day of August, 2009

David J. Kappos
*Director of the United States Patent and Trademark Office*